United States Patent [19]
Hayakawa et al.

[11] Patent Number: 5,191,289
[45] Date of Patent: Mar. 2, 1993

[54] RF-COIL FOR MRI APPARATUS

[75] Inventors: Hiroshi Hayakawa, Ootawara; Toru Aratani, Yokohama, both of Japan

[73] Assignee: Kabushiki Kaisha Toshiba, Japan

[21] Appl. No.: 638,162

[22] Filed: Jan. 4, 1991

[30] Foreign Application Priority Data

Jan. 10, 1990 [JP] Japan .................................. 2-1146[U]

[51] Int. Cl.⁵ .............................................. G01V 3/00
[52] U.S. Cl. ..................................... 324/318; 324/322
[58] Field of Search ............... 324/300, 307, 309, 318, 324/322; 333/219

[56] References Cited

U.S. PATENT DOCUMENTS

| | | | |
|---|---|---|---|
| 4,591,818 | 5/1986 | Butson | 335/299 |
| 4,660,013 | 4/1987 | Laskaris et al. | 335/299 |
| 4,720,680 | 1/1988 | Nishihara et al. | 324/318 |
| 4,725,803 | 2/1988 | Prevot et al. | 335/299 |
| 4,875,013 | 10/1989 | Murakami et al. | 324/318 |

*Primary Examiner*—Louis Arana
*Attorney, Agent, or Firm*—Limbach & Limbach

[57] ABSTRACT

An RF coil for MRI apparatus is provided which comprises a dielectric unit, such as a bobbin, plurality of coil conductors formed on the outer peripheral surface of the dielectric unit in a mutually adjacent relation to generate a magnetic field, and frame, such as a guard ring, provided on the inner surface of the dielectric unit to define a bobbin portion of the dielectric unit. An accommodation space is provided inside the bobbin to located a living substance to be examined, allowing an RF wave to be transmitted and received to and from the subject in the accommodation space. A plurality of openings are provided in the dielectric unit per se at a location of the bobbin portion. By so doing, it is possible to reduce an induction loss in the bobbin portion which would otherwise be damaging to the electrical function of the RF coil and to obtain an RF coil of an improved Q-factor.

7 Claims, 5 Drawing Sheets

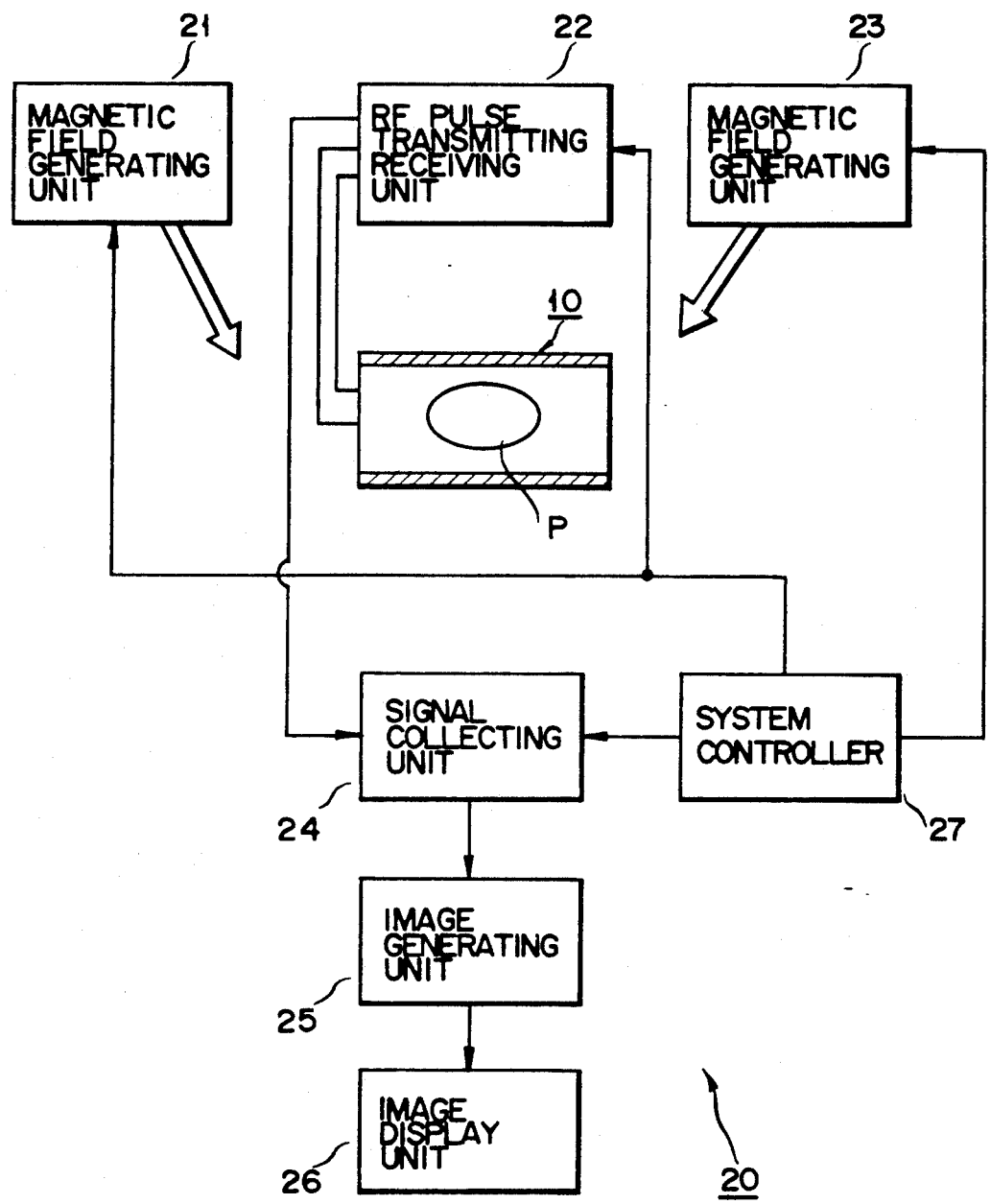
F I G. 4

RF-COIL FOR MRI APPARATUS

BACKGROUND OF THE INVENTION

1. Field of the Invention

The present invention relates to an improved Q factor-built-in RFC (Radio frequency coil) for magnetic resonance imaging (MRI) apparatus including a dielectric component.

2. Description of the Related Art

As an RF coil for MRI apparatus, use has generally been made of a coil called "STR (Slot Tube Resonator)" as shown in FIG. 6.

In FIG. 6, an RF coil 1 comprises a bobbin 2 composed of a cylindrical dielectric unit, conductor bands 3 oppositely arranged, as coil conductors, at four places on the outer periphery of the bobbin 2 in the longitudinal direction of the bobbin 2, and a pair of guard rings 4 provided one at each inner end portion of the bobbin 2. The conductor band 3 and guard ring 4, being greater in their width, lead to a smaller inductance as a merit. The conductor band 3 and guard ring 4 can be so designed as to be employed under a high magnetic field of over 0.5 T (tesla), that is, under a resonant frequency of 21.3 MHz in a hydrogen atom.

In medical diagnosis, the RF coil 1 enables a radiofrequency wave to be transmitted and received to and from a living subject, that is, a subject to be examined, located in the cylindrical unit and hence acquires an MR signal. The MR (Magnetic Resonance) signal thus acquired is supplied to an image forming unit in an MRI apparatus where it is reconstituted through a two-dimensional Fourier transformation. The reconstituted image is supplied to an output unit, that is, an image display unit, where an MRI is displayed.

Upon transmission and reception to and from the subject, the RF coil 1 is so operated as indicated by an equivalent circuit regarding the RF coil in FIG. 7. Stated in more detail, a current flows in the circuit in a direction indicated by the solid and dotted lines in FIG. 7, enabling MR signals to be detected along two channels $CH_1$ and $CH_2$. This circuit can gain an S/N (signal to noise) ratio $\sqrt{2}$ times as great as that in the case where such detection is made along one channel.

The bobbin 2, per se, at those portions 5 between the conductor band 3 and the guard ring 4 provide electrostatic capacitance $C_1$. Let it be assumed that, as will be seen from a concept diagram in FIG. 8, an area at the bobbin portion 5 between the coil conductor 3 and the guard ring 4 is represented by $A_1$, a distance (thickness) between the coil conductor 3 and the guard ring 4 by N and the dielectric constant at the aforementioned portion of the bobbin by $\epsilon$. Then the following relation is established:

$$Cl = \epsilon \cdot (A_1/L)$$

Upon the transmission and reception of the RF waves to and from the coil 1, electric lines of force are concentrated at the bobbin portion 5, creating a dielectric loss. According to experiments conducted by the inventor, it has been found that a Q-factor, in a nonload state, of the coil 1 is as low as 80 (measured data).

Let it be assumed that the dielectric loss can be reduced by setting, smaller, the electrostatic capacitance $C_1$ at the bobbin portion 5. Then the Q-factor is improved or increased, resulting in an improvement in the S/N ratio of the MR image.

The reduction of the electrostatic capacitance $C_1$ at the bobbin portion 5 can be achieved by setting, greater, the distance L between the coil conductors 3 and 4. However, the coil 1 becomes bulkier by doing so. Further, if the area $A_1$ contacting with the bobbin at the bobbin portion 5 defined above is made smaller, the conductive loss is increased, failing to obtain an improved Q-factor. The bobbin 2, being formed of a dielectric of smaller dielectric constant, such as Teflon (registered trademark), results in added costs in apparatus, due to a restriction imparted to a material of which the bobbin 2 is formed.

The aforementioned conventional coil cannot obtain an improved Q-factor because a greater influence is exerted by the electrostatic capacitance of the dielectric bobbin portion between the coil conductors 3 and 4.

SUMMARY OF THE INVENTION

It is according the object of the present invention to provide an RF coil for MRI (magnetic resonance imaging) apparatus, which can improve its Q-factor.

According to the present invention, there is provided an RF coil for magnetic resonance imaging apparatus which comprising: a dielectric unit having an inner surface and outer peripheral surface, a plurality of coil conductors arranged on the outer peripheral surface of the dielectric unit in an mutually adjacent relation to generate a magnetic field, and a plurality of frames provided on the inner surface of the dielectric unit, wherein an accommodation space for locating a living subject therein for examination is defined inside the hollow dielectric unit to allow an RF wave to be transmitted and received to and from the subject located in the space, and at least one opening for reducing dielectric loss throughout the RF coil is provided in that portion of the dielectric unit corresponding to the frame.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram generally showing an MRI apparatus to which is applied an RF coil of the first embodiment shown in FIG. 1A;

DETAILED DESCRIPTION OF THE PREFERRED EMBODIMENTS

Figure 6:
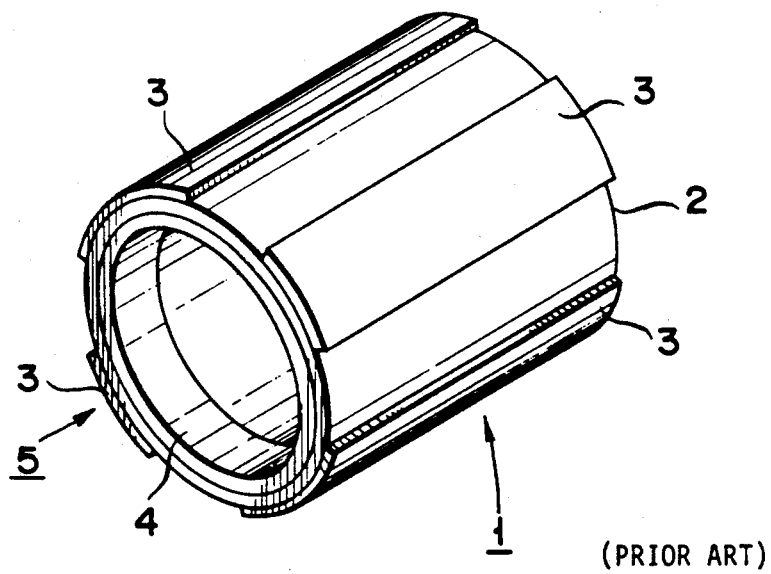
FIG. 6 is a perspective view showing a conventional RF coil.

According to a first embodiment of the present invention, an RF coil 10 comprises a bobbin 12 formed of a cylindrical dielectric unit of 480 mm in length $\times$ 5 mm in thickness $\times$ 320 mm in inner diameter, conductor bands 13 oppositely arranged at four places on the outer periphery of the bobbin 12 in the longitudinal direction of the cylindrical dielectric unit 12 and serving as a coil conductor, and guard rings 14 of 50 mm in width provided one at each inner end portion of the bobbin and serving as a coil conductor. An accommodation space 16 is provided inside the bobbin/guard ring unit to accommodate a living thing P, that is, a subject to be examined. The conductor band 13 and guard ring 14 are of a larger-diameter ring type as in the conventional one as shown in FIG. 6 and are so designed as to set the inductance smaller and to treat a high frequency of over 20 MHz as an RF wave.

Figure 1A:
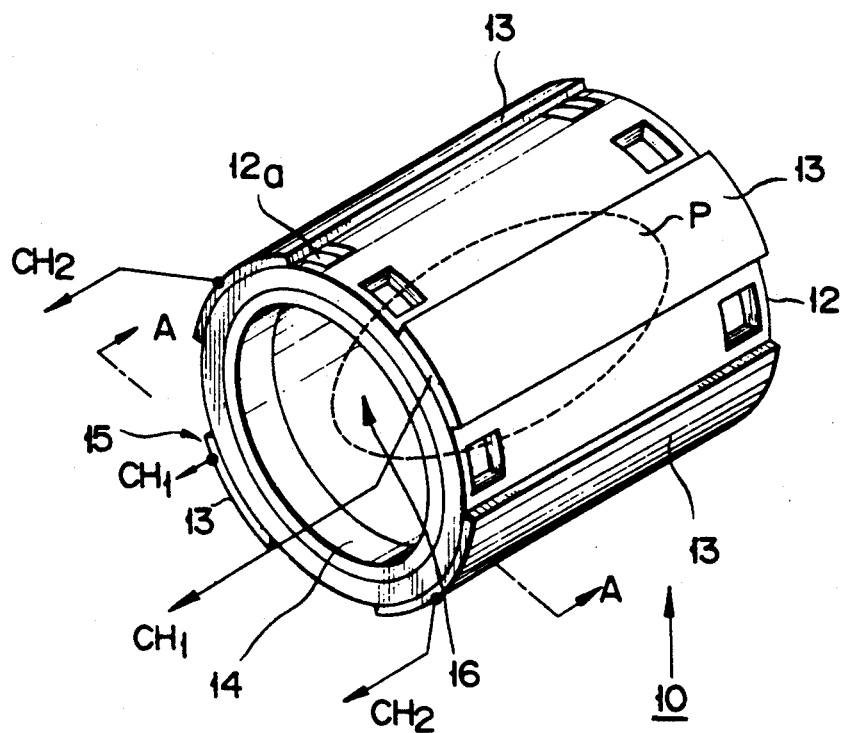
FIG. 1A is a perspective view showing an RF coil, for MRI apparatus, according to a first embodiment of the present invention.
Figure 1B:
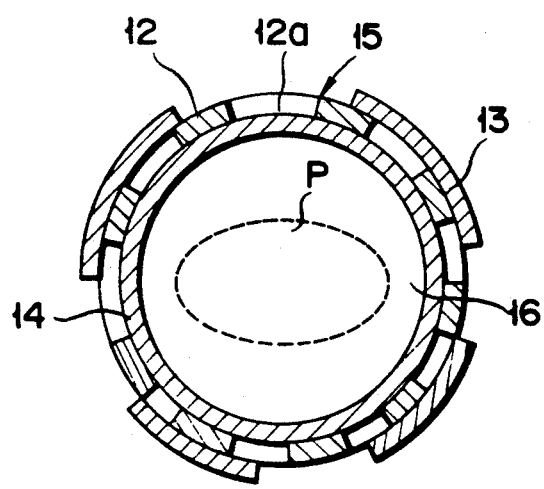
FIG. 1B is a cross-sectional view, as taken line A—A in FIG. 1A, showing the RF coil of the first embodiment.
Figure 2:
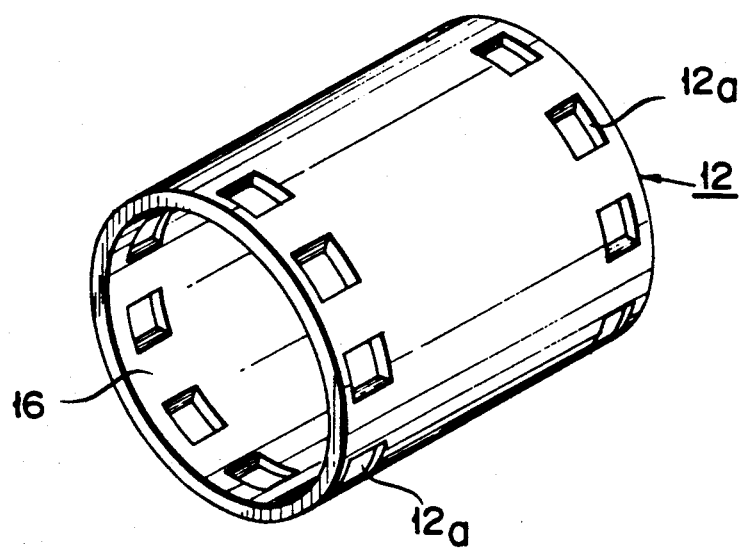
FIG. 2 is a perspective view showing the bobbin of the RF coil.

FIG. 1B is a cross-sectional view, taken along line A—A, showing an RF coil of FIG. 1B, and FIG. 2 is a perspective view showing an outer appearance of the bobbin 12 as a simple unit.

A plurality of rectangular openings 12a are formed at a location opposed to the guard ring 14 and are 40 mm in the longitudinal direction of the cylindrical unit and 50 mm in the peripheral direction of the cylindrical unit. The ratio of the opening 12a to that portion of the bobbin 12 facing the guard ring is represented by an "area" ratio and is 5/6. The openings 12a are provided at a location situated between the coil conductors 13 and 14 in close proximity and at a location defined by the bobbin 12, guard ring 14 and conductor band 13, as in the RF coil 10 of the present embodiment, positively achieving further reduction of the dielectric loss.

Figure 3:
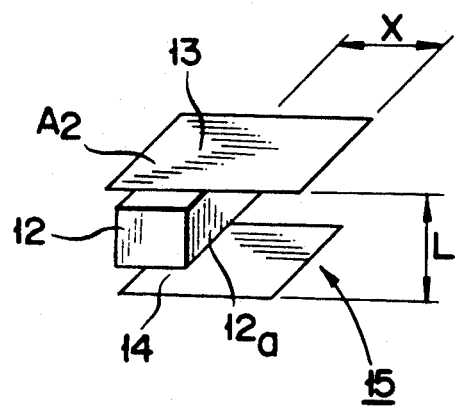
FIG. 3 is a concept diagram for explaining the induction constant of the RF coil.

FIG. 3 is a concept diagram showing a structural model at or near the bobbin portion 15 as seen from the standpoint of electricity. Let it be assumed that the area of the conductor is represented by $A_2$, lengths of the coil conductors 13 and 14 (the conductor 13 not in contact with the dielectric bobbin 12) by x, and dielectric constant in the air by $\epsilon_0$. In this case, an electrostatic capacitance $C_2$ as stored at and near the bobbin portion 15 is represented by:

$$C_2 = \epsilon_0(xA_2)/L + \epsilon(1 - x)A_2/L$$
$$= \{\epsilon - (\epsilon - \epsilon_0)x\}A_2/L$$

In the expression above, $x/A_2$ represents a ratio (e.g. opening ratio) of the openings 12a to the whole area of the coil conductors 13 and 14. From this it will be appreciated that, the greater the length x of the coil conductor not in contact with the dielectric unit, the lower the electrostatic capacitance $C_2$.

The dielectric constant $\epsilon''$ is present in the dielectric unit as a resistive component. The dielectric constant $\epsilon''$ is reduced by setting the volume of the dielectric unit smaller. It is thus possible to prevent an increase of a resistive value in the bobbin portion 15 by reducing the area of contact between the conductor and the dielectric unit.

Further, an external capacitor may be attached to the bobbin which has the openings 12a.

The application of the aforementioned RF coil 10 to an MRI apparatus 20 as one component element will be explained with respect to FIG. 4.

The MRI apparatus 20 comprises a static magnetic field generating unit 21 for generating a static magnetic field as high as 1.5 teslas at a location where a subject to be examined lies, RF pulse transmitting/receiving unit 22 for applying an RF pulse as an RF wave to the subject, a gradient field generation unit 23 for generating a gradient field in an overlapping relation to the aforementioned static magnetic field, signal collecting unit 24 for collecting an MR signal as an RF wave which has been received from the subject P via the RF pulse transmitting/receiving unit 22, image generating unit 25 for performing a two-dimesional Fourier transformation based on the MR signal and reconstituting an MR image corresponding to the subject, image display unit 26 for visualizing the MR image reconstituted by the image generating unit 25, and system controller 27 for coordinating the control operation of each part of the MRI apparatus 20 on the basis of a predetermined pulse sequence. The system controller 27 controls a transmission/reception switching at the transmitting and receiving times. The RF coil 10 of the present invention is used for transmission and reception.

The operation of the MRI apparatus 20 is as follows.

First, the subject P is located in the RF coil 10. The system controller 27 commences the execution of a predetermined pulse sequence so that an MR image may be obtained under control, by the controller, of the associated parts of the apparatus 20. First, the static field generating unit 21 generates a static field in the RF coil 10 under the system controller's control. The gradient field generating unit 23 generates a gradient field in an overlapping relation to the aforementioned static field. Under the system controller's control, the RF pulse transmitting/receiving unit 22 sends an RF pulse from the RF coil 10 to the subject P to excite a predetermined nucleus of an atom in the subject P. An MR signal is generated from the subject P through the excitation of the nucleus. The RF pulse transmitting/receiving unit 22 is switched by the system controller 27 to a receive mode and the MR signal originating from the subject P is received by the RF coil 10. The received MR signal is sent to the signal collecting unit 24.

Figure 7:
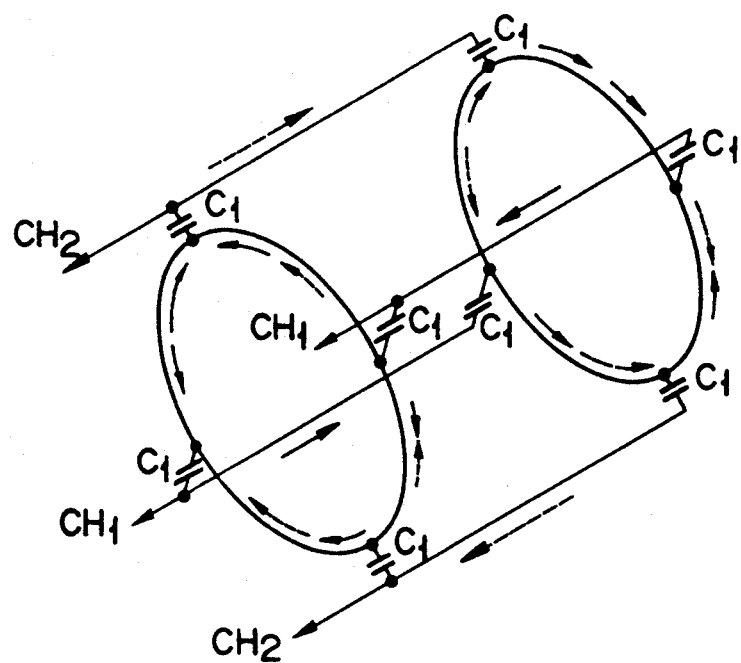
FIG. 7 is a view showing an equivalent circuit.
Figure 8:
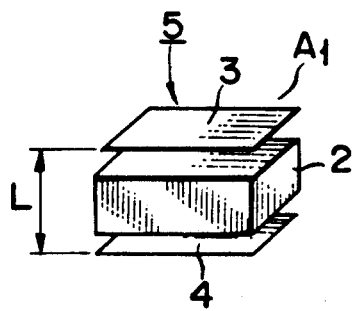
FIG. 8 is a concept diagram for explaining the dielectric constant of the RF coil.

Those electric lines of force originating from the RF pulse and MR signal allow corresponding currents to flow through the corresponding coil conductors 13 and 14 and then bobbin portions 15 to the channels CH1 and CH2. The currents leaving these channels are transmitted and received to and from the RF pulse transmitting/receiving unit 22. Since the bobbin portion 15 has an electrostatic capacity of low "dielectric loss", the RF pulse and MR signal are transmitted and received, effectively, as will be seen from FIGS. 3 and 7.

Based on the MR signal obtained from the signal collecting unit 24, the image generating unit 25 performs a "two-dimensional Fourier transformation" to reconstitute an MR image corresponding to the subject P. The MR image is visualized on the image display unit 26.

According to the experimental data gained by the inventor, the present RF coil 10 reveals a Q-factor of 250 in an non-load state, a value which is over 3 times that of the conventional coil 1. That is, the Q-factor of the present RF coil 10 is largely improved over that of the conventional one. Further, the present RF coil is so formed that the MR signal is detected at the two channels $CH_1$ and $CH_2$, gaining a better MR image with a higher S/N ratio. The present coil per se can be made lighter in weight, because the plurality of openings 12a are provided in the bobbin 12.

Figure 5:
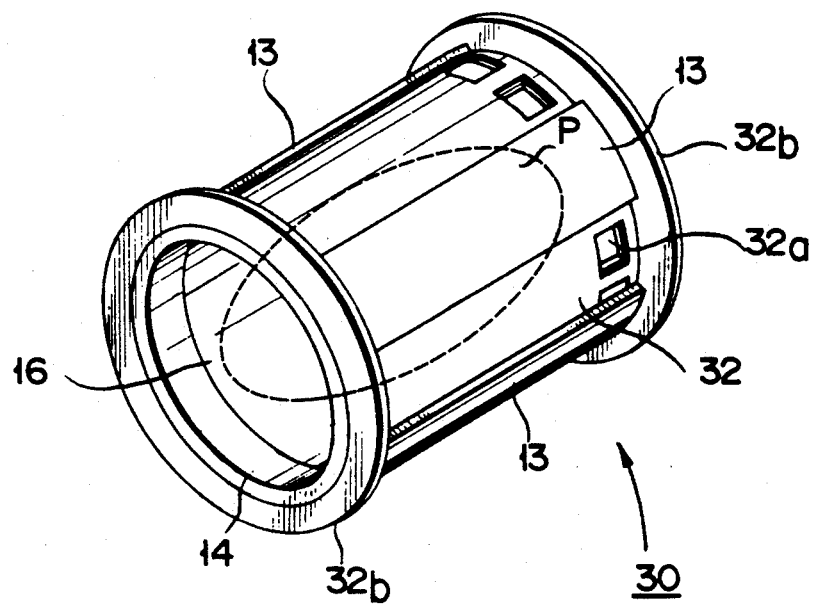
FIG. 5 is a perspective view showing an RF coil, for MRI apparatus, according to a second embodiment of the present invention.

FIG. 5 is a perspective view showing an RF coil 30 according to a second embodiment of the present invention. The RF coil 30 of the second embodiment is principally different from that of the first embodiment in that a pair of flanges 32b, 32b are mounted one on each end of the coil of the first embodiment to provide the RF coil of high mechanical strength of rigidity as shown in FIG. 5.

A plurality of openings 32a are provided in a bobbin 32 of the RF coil 30 (FIG. 5) as in the case of the RF coil 10 shown in FIG. 1, but the flanges 32b are projected from the ends of the bobbin to provide added strength to an otherwise, somewhat weakened bobbin structure responsible for the presence of the openings 32a.

Thus the RF coil 30 reveals a mechanical strength of rigidity equal to, or greater than, that of the coil 10 of the first embodiment and can obtain the same function or merit as set out above in conjunction with the first embodiment.

In place of mounting the pair of flanges one on each end of the bobbin as in the second embodiment to impart added strength of rigidity to otherwise, somewhat weakened bobbin, use may be made of an RF coil having the aforementioned openings filled with a material of smaller dielectric loss, such as an ABS resin or foamed styrol. This modification can eliminated the aforementioned, rather weak point as encountered in the aforementioned embodiment and can equally attain the object of the present invention.

The present invention is not restricted to the aforementioned embodiments and modification and can be variously changed or modified without departing from the spirit and scope of the present invention. The present invention can be applied to other types of RF coils, such as a saddle type coil, slotted resonator or bird cage coil.

According to the present invention, an RF coil for MRI apparatus is provided with openings formed in the dielectric bobbin portion defined between coil conductors, which can reduce the dielectric loss and hence improve a resultant Q-factor of the coil.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. An RF coil for magnetic resonance imaging apparatus, comprising:
   a dielectric unit having an inner surface and outer peripheral surface;
   a plurality of coil conductor means for generating a magnetic field, said coil conductor means arranged on the outer peripheral surface of the dielectric unit in a mutually adjacent relation;
   a plurality of frames provided on the inner surface of the hollow dielectric unit, wherein
   an accommodation space for locating a living subject therein for examination is defined inside the hollow dielectric unit to allow an RF wave to be transmitted and received to and from the subject located in the space, and
   a plurality of openings in said dielectric unit for reducing dielectric loss arranged in a circumferential portion of the dielectric unit between the frames and the coil conductor means.

2. The RF coil according to claim 1, wherein said dielectric unit is substantially cylindrical in configuration, said frame is provided on each end portion of the inner surface of the cylindrical dielectric unit, said accommodation space is provided inside the cylindrical dielectric unit and extends between the two frames, and each of said plurality of coil conductors is positioned substantially diametrically opposite to one another across said accommodation space.

3. The RF coil according to claim 2, wherein the plurality of openings are provided at a predetermined interval along the end portions of said cylindrical dielectric unit.

4. The RF coil according to claim 1, 2 or 3, wherein said plurality of coil conductors are provided on the outer peripheral surface of the dielectric unit and extend in a band-like fashion in a longitudinal direction on the outer peripheral surface of the dielectric unit.

5. The RF coil according to claim 3, wherein a pair of flanges are provided one on each end of said dielectric unit and coil conductors.

6. The RF coil according to claim 1, wherein said openings are filled with a material of induction loss to provide a structure integral with said dielectric unit.

7. The RF coil according to claim 1, 2 or 3, wherein said coil conductors are provided, in a longitudinal direction, as band-like ones, on the outer peripheral surface of the hollow dielectric unit, and capacitor means is provided for connecting the frame to the coil conductor in place of said dielectric unit and has an electrostatic capacitance which is created at the circumferential portion of said dielectric unit.

* * * * *